United States Patent
Zhou et al.

(10) Patent No.: US 7,291,514 B2
(45) Date of Patent: Nov. 6, 2007

(54) BOTTOM ELECTRODE CHEMICALLY-BONDED LANGMUIR-BLODGETT FILMS VIA PHOTOLABILE GROUPS

(75) Inventors: Zhang-Lin Zhou, Mountain View, CA (US); Yong Chen, Sherman Oaks, CA (US); Xiao-An Zhang, Sunnyvalle, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 680 days.

(21) Appl. No.: 10/792,961

(22) Filed: Mar. 2, 2004

(65) Prior Publication Data

US 2005/0194526 A1    Sep. 8, 2005

(51) Int. Cl.
*H01L 51/40* (2006.01)

(52) U.S. Cl. .............................. 438/99; 438/82; 257/40

(58) Field of Classification Search .................. 257/40, 257/253; 438/49, 82, 99
See application file for complete search history.

(56) References Cited

U.S. PATENT DOCUMENTS

| | | | | |
|---|---|---|---|---|
| 6,128,214 | A * | 10/2000 | Kuekes et al. | 365/151 |
| 6,459,095 | B1 * | 10/2002 | Heath et al. | 257/14 |
| 6,763,158 | B1 * | 7/2004 | Zhang et al. | 385/16 |
| 2002/0176276 | A1 * | 11/2002 | Zhang et al. | 365/151 |

OTHER PUBLICATIONS

U.S. Appl. No. 09/844,862, filed Apr. 27, 2001, Xiao-An Zhang et al.
Collier, C.P. et al.: "Electronically Configurable Molecular . . . "; American Assn. for the Advancement . . . ; Jul. 16, 1999; XP002149479.
Collier, C.P., et al.: "A (2) cantenane-based solid . . . " American Assn. for the Advancement . . . ; Aug. 18, 2000; XP002955272.
Blinov, L.M.: "Langmuir-Films" Soviet Physics Uspekhi, Amer. Institute of Physics, New York; Jul. 1, 1988; XP000117736.

* cited by examiner

*Primary Examiner*—Jerome Jackson
*Assistant Examiner*—Anthony Ho

(57) ABSTRACT

Langmuir-Blodgett films are provided in which a molecule is chemically bonded with a bottom electrode substrate as part of a crossed wire device comprising two electrodes and a molecular layer therebetween. The molecule, which comprises a switchable moiety and a connecting moiety, is provided with a photolabile capping group attached to the connecting moiety. The photolabile capping group temporarily caps the reactive connecting group of the molecule. The capped molecules are processed to form a LB film on the water-air interface of water. The films are then exposed to UV light. The photolabile capping group decomposes to give back the connecting group, which remains in the water. As the uncapped LB films are transferred to a bottom electrode substrate, the surface of the electrode reacts with the reactive connecting group of the molecule to form a chemically bonded LB layer on the substrate, thereby providing improved LB films.

20 Claims, 5 Drawing Sheets

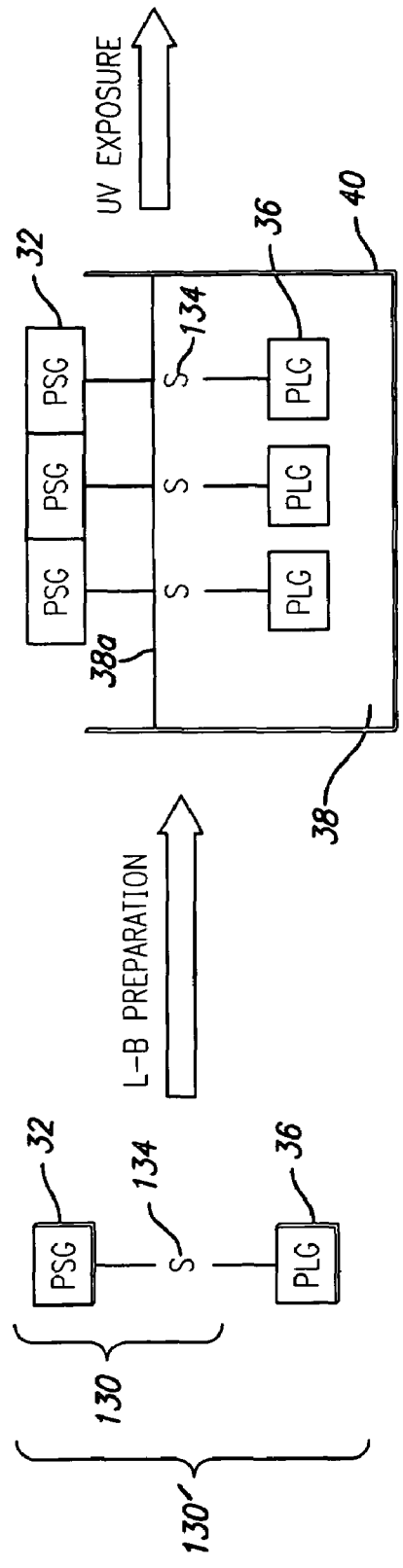
FIG. 4a
FIG. 4b
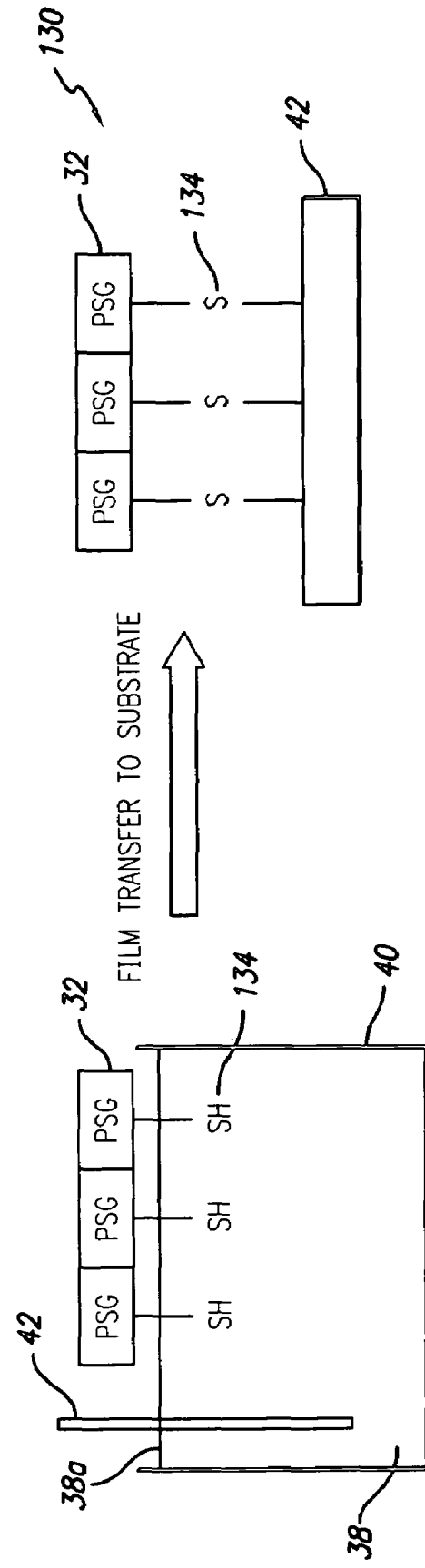
FIG. 4c
FIG. 4d

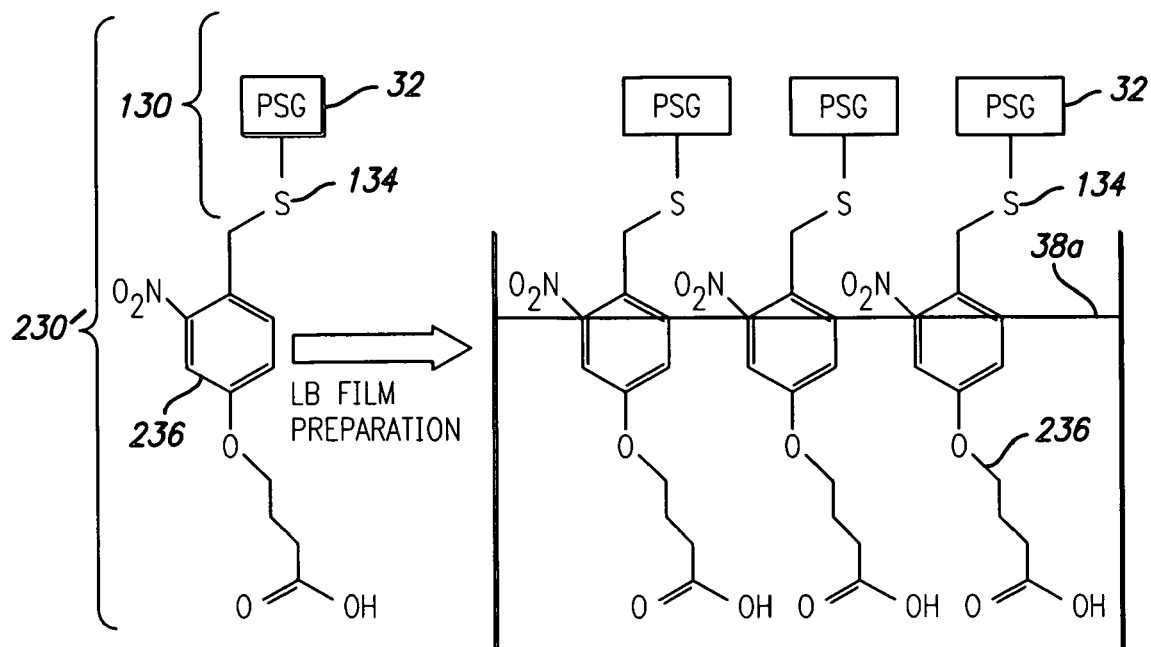
FIG. 5a
FIG. 5b
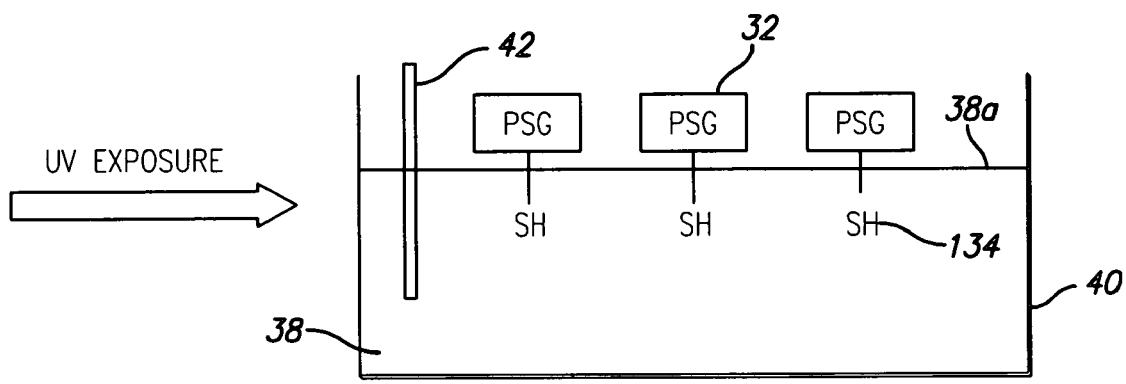
FIG. 5c
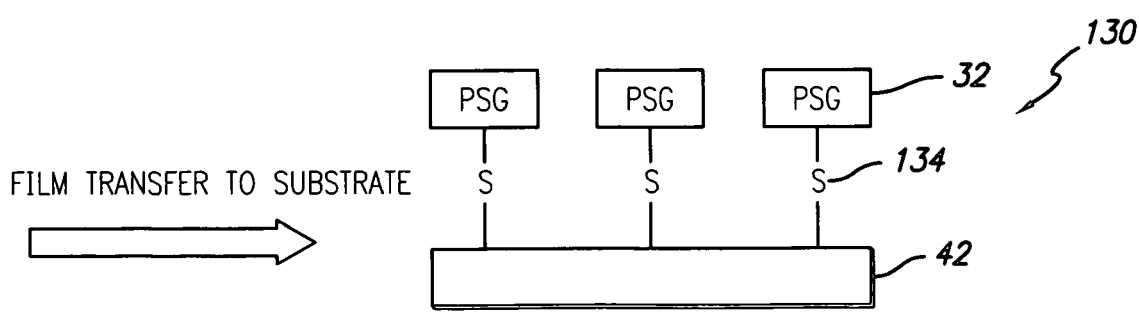
FIG. 5d

BOTTOM ELECTRODE CHEMICALLY-BONDED LANGMUIR-BLODGETT FILMS VIA PHOTOLABILE GROUPS

TECHNICAL FIELD

The present invention is directed to molecular devices comprising two electrodes and a switchable molecular layer therebetween, and, more particularly, to the formation of such layers that are chemically bonded on the bottom electrode by Langmuir-Blodgett methods.

BACKGROUND ART

Molecular devices comprising two electrodes (a bottom electrode and a top electrode) and a molecular switching layer at the junction of the two electrodes are well known. Such devices are useful, for example, in the fabrication of devices based on electrical switching, such as molecular wire crossbar interconnects for signal routing and communications, molecular wire crossbar memory, molecular wire crossbar logic employing programmable logic arrays, multiplexers/demultiplexers for molecular wire crossbar networks, molecular wire transistors, etc., and in the fabrication of devices based on optical switching, such as displays, electronic books, rewritable media, electrically tunable optical lenses, electrically controlled tinting for windows and mirrors, optical crossbar switches, for example, for routing signals from one of many incoming channels to one of many outgoing channels, etc. Typically, the molecular switching film comprises an organic molecule that, in the presence of an electrical (E) field, switches between two or more energetic states, such as by an electro-chemical oxidation/reduction (redox) reaction or by a change in the band gap of the molecule induced by the applied E-field.

It is important to form a good electric contact to the organic molecular layer in order to fabricate molecular devices. Molecules with special chemical end groups can form direct chemical bonding with metal/semiconductor electrodes to form a self-assembled layer (SAM), which can have a good electric contact with electrodes. However, the molecular layer formed on the top surface of the electrode usually has a high density of defects. If a second electrode is formed on top of the molecular layer via metal deposition methods, then an electric short can form between the first and second electrode through the defects in the molecular layer.

The formation of Langmuir-Blodgett (LB) layers employing such molecules would be preferable, because such films are known to have quite a higher density, as compared with SAM films. However, such LB films do not bond well to the electrode substrate.

Thus, there is a need for providing a high density molecular layer on a bottom electrode that also bonds well with the electrode.

DISCLOSURE OF INVENTION

In accordance with an embodiment of the teachings herein, an improved method is provided for attaching a molecular layer to a substrate wherein the molecular layer comprises an organic molecule having at least one switching moiety and a connecting group attached to a switching moiety. The method comprises:

providing the molecule comprising at least one such switch moiety and the connecting group, together with a photolabile group attached to the connecting group to form a capped molecule;

forming a Langmuir-Blodgett film of the capped molecule on a water surface;

exposing the capped molecule to ultraviolet radiation of a wavelength sufficient to cleave the photolabile group from the capped molecule, thereby yielding the original molecule; and passing the substrate through the Langmuir-Blodgett film to form the molecular layer that is chemically bonded on the substrate.

Another embodiment of the present teachings is directed to a method of forming a crossed wire molecular device comprising a plurality of bottom electrodes, a plurality of top electrodes that cross said bottom electrodes at a non-zero angle, and a molecular layer comprising an organic molecule having at least one switching moiety, with the molecular layer formed in at least some junctions formed where one electrode crosses another electrode. The method comprises:

carrying out the process described above to form the molecular layer on the bottom electrode; and forming the top electrode crossing the bottom electrode at the non-zero angle, thereby forming a junction therebetween, wherein the molecular layer is formed at least in the junction.

In another embodiment of the present teachings, a molecule for Langmuir-Blodgett deposition of a molecular layer is provided. As described above, the molecule comprises at least one switching moiety, a connecting group attached to a switching moiety, and a photolabile group attached to the connecting group. The photolabile group is cleavable from the connecting group in the presence of ultraviolet radiation.

In yet another embodiment of the present teachings, a molecular switching device is provided, comprising at least one bottom electrode and at least one top electrode. The top electrode crosses the bottom electrode at a non-zero angle, thereby forming a junction, and a molecular layer is disposed in the junction. The molecular layer comprises at least one molecule having at least one switching moiety and a connecting group attached to a switching moiety. The molecular layer is formed on the bottom electrode by a Langmuir-Blodgett process to deposit the layer from the molecule having a photolabile group attached to the connecting layer, cleaved by exposure to ultraviolet radiation prior to the formation on the bottom electrode by the Langmuir-Blodgett process.

BRIEF DESCRIPTION OF THE DRAWINGS

FIG. 1b is a perspective elevational view, depicting the crossed-wire device shown in FIG. 1a;

FIG. 4 is similar to FIG. 3, but depicts a more specific molecular system that uses thiol as a connecting group; and FIG. 5 is similar to FIG. 4, but depicts an example of an actual molecular system that uses thiol as the connecting group and 1-(2-nitrophenyl) ether as a photolabile group.

BEST MODES FOR CARRYING OUT THE INVENTION

Reference is made now in detail to specific embodiments, which illustrates the best mode presently contemplated by the inventors for practicing the teachings disclosed herein. Alternative embodiments are also briefly described as applicable.

Figure 1A:
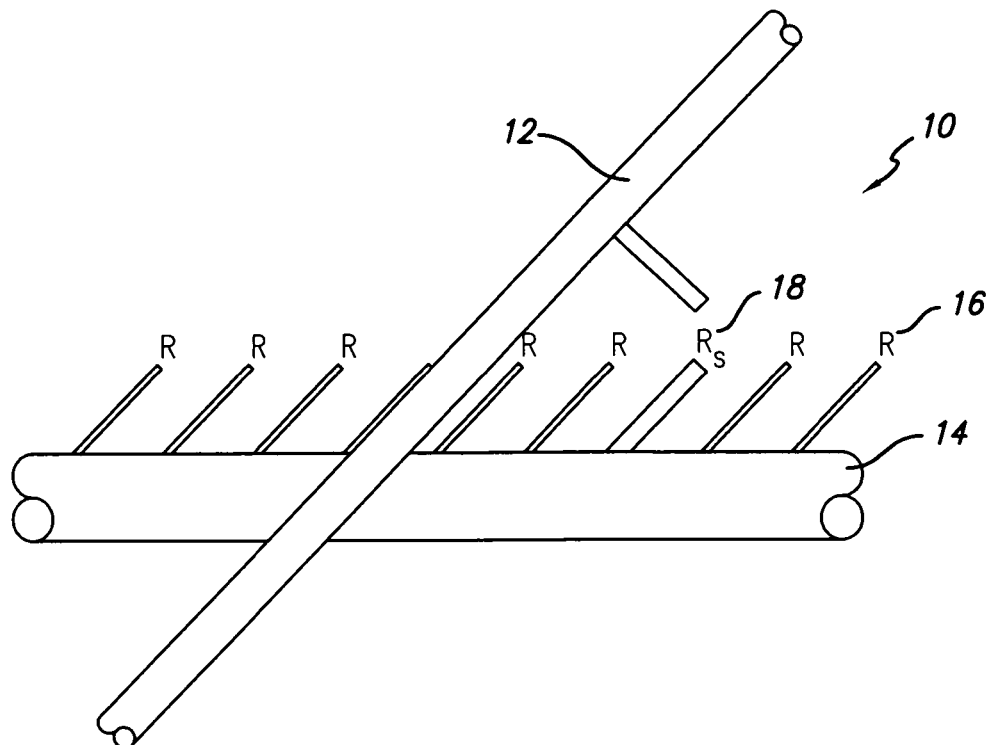
FIG. 1a is a schematic representation of two crossed wires, with at least one molecule at the intersection of the two wires.
Figure 1B:
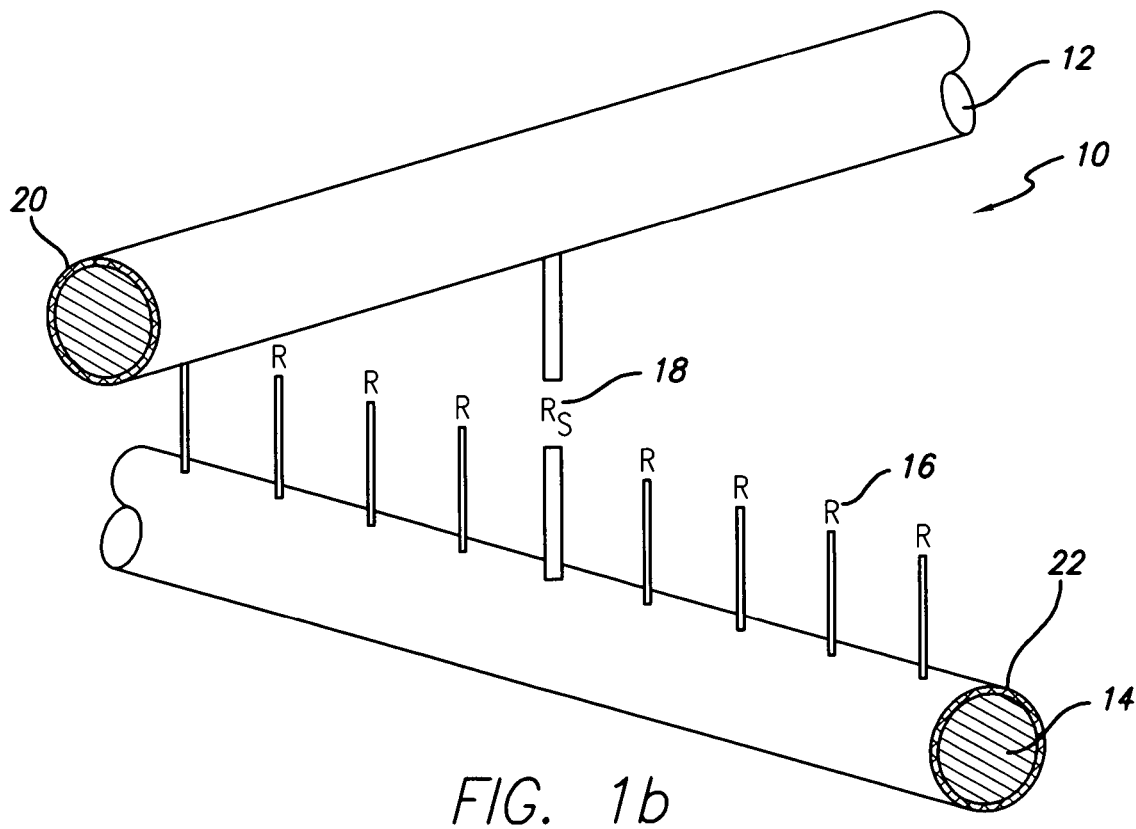

The essential device features are shown in FIGS. 1a-1b. A crossed wire switch 10 comprises two wires 12, 14, each either a metal or semiconductor wire, that are crossed at some non-zero angle. In between those wires is a layer of molecules or molecular compounds 16, denoted R in FIGS. 1a and 1b. The particular molecules 18 (denoted $R_s$) that are sandwiched at the intersection of the two wires 12, 14, also interchangeably referred to herein as a junction, are identified as switch molecules.

There are two primary methods of operating such switches, depending on the nature of the switch molecules 18. As mentioned above, the molecular switching layer 16 comprises an organic molecule 18 that, in the presence of an electrical (E) field, switches between two or more energetic states, such as by an electro-chemical oxidation/reduction (redox) reaction or by a change in the band gap of the molecule induced by the applied E-field.

In the former case, when an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch. Examples of molecules 18 that exhibit such redox behavior include rotaxanes, pseudo-rotaxanes, and catenanes; see, e.g., U.S. Pat. No. 6,459,095, entitled "Chemically Synthesized and Assembled Electronic Devices", issued Oct. 1, 2002, to James R. Heath et al, which is incorporated herein by reference.

Further, the wires 12, 14 can be modulation-doped by coating their surfaces with appropriate molecules—either electron-withdrawing groups (Lewis acids, such as boron trifluoride ($BF_3$)) or electron-donating groups (Lewis bases, such as alkylamines) to make them p-type or n-type conductors, respectively. FIG. 1b depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed. Or yet alternatively, the wires 12, 14 may be coated with molecular species 20, 22, respectively, for example, that enable one or both wires to be suspended to form colloidal suspensions, as discussed below. Details of such coatings are provided in above-referenced U.S. Pat. No. 6,459,095.

In the latter case, examples of molecule 18 based on field induced changes include E-field induced band gap changes, such as disclosed and claimed in patent application Ser. No. 09/823,195, filed Mar. 29, 2001, published as Publication No. 2002/0176276 on Nov. 28, 2002, which is incorporated herein by reference. Examples of molecules used in the E-field induced band gap change approach include molecules that evidence:

- molecular conformation change or an isomerization;
- change of extended conjugation via chemical bonding change to change the band gap; or
- molecular folding or stretching.

Changing of extended conjugation via chemical bonding change to change the band gap may be accomplished in one of the following ways:

- charge separation or recombination accompanied by increasing or decreasing band localization; or
- change of extended conjugation via charge separation or recombination and π-bond breaking or formation.

The formation of micrometer scale and nanometer scale crossed wire switches uses either a reduction-oxidation (redox) reaction to form an electro-chemical cell or using E-field induced band gap changes to form molecular switches. In either case, the molecular switches typically have two states, and may be either irreversibly switched from a first state to a second state or reversibly switched from a first state to a second state. In the latter case, there are two possible conditions: (1) either the electric field may be removed after switching into a given state, and the molecule will remain in that state ("latched") until a reverse field is applied to switch the molecule back to its previous state, or (2) removal of the electric field would cause the molecule to revert to its previous state, and hence the field must be maintained in order to keep the molecule in the switched state until it is desired to switch the molecule to its previous state.

Color switch molecular analogs, particularly based on E-field induced band gap changes, are also known; see, e.g., application Ser. No. 09/844,862, filed Apr. 27, 2001.

Figure 2:
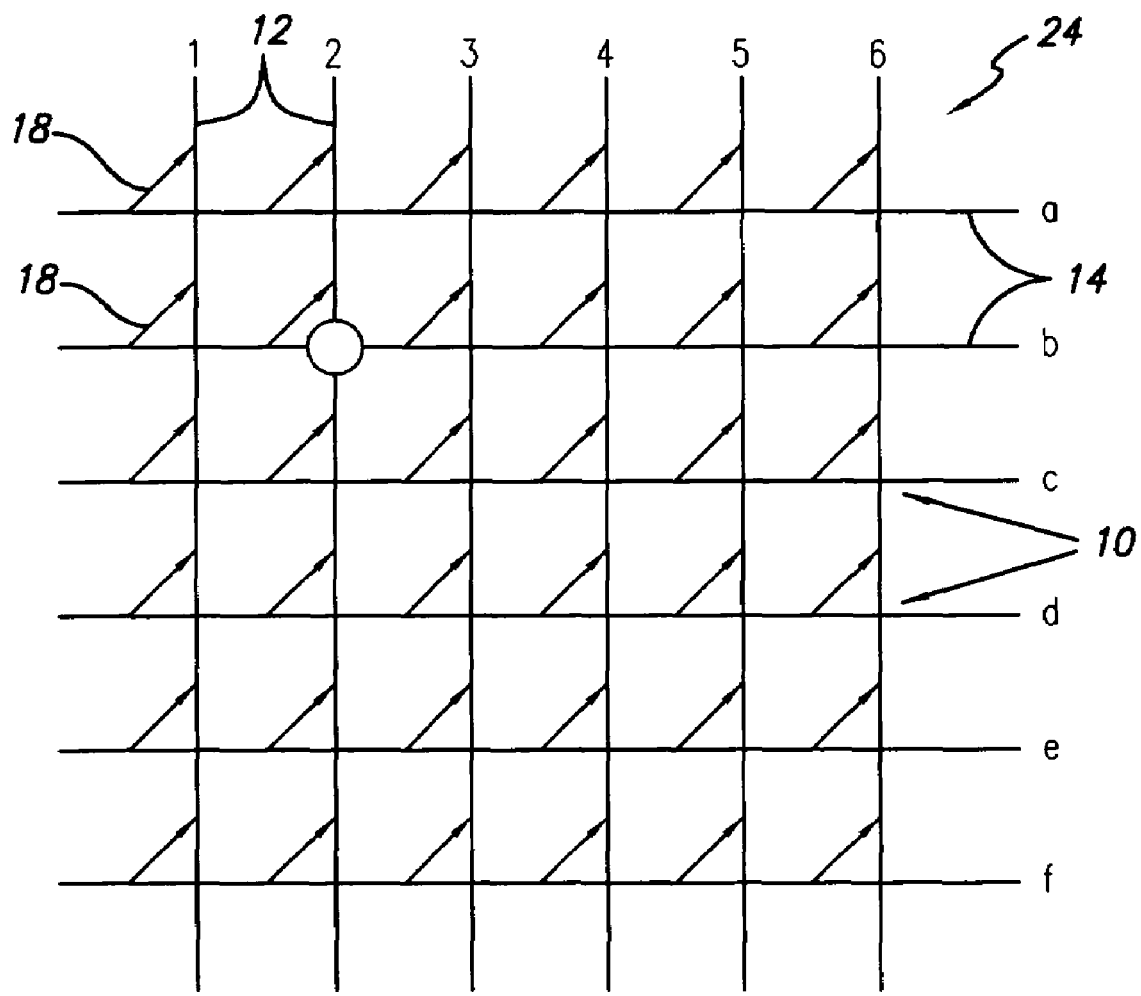
FIG. 2 is a schematic representation of a two-dimensional array of switches, depicting a 6×6 crossbar switch.

As illustrated in FIG. 2, the switch 10 can be replicated in a two-dimensional array to form a plurality, or array, 24 of switches to form a crossbar switch. FIG. 2 depicts a 6×6 array 24, but the embodiments herein are not so limited to the particular number of elements, or switches, in the array. Access to a single point, e.g., 2b, is done by impressing voltage on wires 2 and b to cause a change in the state of the molecular species 18 at the junction thereof, as described above. Thus, access to each junction is readily available for configuring only those that are pre-selected. Details of the operation of the crossbar switch array 24 are further discussed in U.S. Pat. No. 6,128,214, entitled "Molecular Wire Crossbar Memory", issued on Oct. 3, 2000, to Philip J. Kuekes et al, which is incorporated herein by reference.

In accordance with an embodiment of the teachings herein, an improved method of attaching a molecular layer to a substrate wherein the molecular layer comprises an organic molecule having at least one switching moiety and a connecting group attached to a switching moiety. The method comprises:

- providing the molecule comprising at least one such switch moiety and the connecting group, together with a photolabile group attached to the connecting group to form a capped molecule;
- forming a Langmuir-Blodgett film of the capped molecule on a water surface;
- exposing the capped molecule to ultraviolet radiation of a wavelength sufficient to cleave the photolabile group from the capped molecule, thereby yielding the original molecule; and passing the substrate through the Langmuir-Blodgett film to form the molecular layer that is chemically bonded on the substrate.

The present embodiments herein provide a practical method to prepare a bottom electrode to which are chemically bonded Langmuir-Blodgett monolayer molecular layers. Almost all Langmuir-Blodgett (LB) layers are based on physical interactions between the electrode substrate and the target molecule, such as hydrophilic and hydrophobic interactions, etc. As is well known, the molecules making up an LB film on a water surface comprise two portions, a hydrophobic portion, which sticks up above the interface formed by water and air, and a hydrophilic portion, which remains in the water.

The teachings herein are based on introducing a photolabile capping functional group onto the target device molecule, such a molecule being appropriate for LB film processing. The capped molecules are introduced as a film on the water/air interface to form the LB film thereon. Next, the films are exposed to a given or predetermined wavelength of ultraviolet (UV) radiation. The capped molecule decomposes to give back the water-insoluble molecule with a reactive ending, or connecting, group such as —SH, —OH, or pyridine at the bottom of the thin film along with some water-soluble by-products that do not interfere in the film deposition onto the bottom electrode. As the uncapped LB films are transferred onto the bottom electrode, such as by dipping the substrate into the water with LB film thereon, the uncapped reactive group of the molecule reacts with the surface substrate of the bottom electrode to form a monolayer of the molecule on the substrate that is chemically bonded thereto.

Turning now to FIG. 3, a generic molecule 30, utilized in the practice of the teachings herein, is depicted. FIG. 4 depicts a more specific molecular system with thiol as a connecting group, while FIG. 5 depicts an even more specific molecular system with thiol as the connecting group and 1-(2-nitrophenyl)ether as the photolabile group.

In FIG. 3, generic molecule 30 comprises three portions 32, 34, 36, labeled "PSG", "Con", and "PLG", respectively. The PSG moiety 32 comprises any potential switchable molecular group, including, but not limited to, rotaxanes and hydrocarbons (either saturated or unsaturated) or substituted hydrocarbon systems having one or more stators and one or more rotors. Other switching moieties may also be used, as discussed above. The Con moiety 34 is a connecting unit between one molecule and a substrate (which can be either an electrode or non-electrode, depending on the application) and is selected from the group consisting of: multivalent hetero atoms (i.e., C, N, O, S, P, etc.) or functional groups containing these hetero atoms (e.g., SH, OH, $SiCl_3$, NH, PH, etc.), hydrocarbons (either saturated or unsaturated), or substituted hydrocarbons. The PLG moiety 36 represents any photolabile capping group, including, but not limited to, any one of the following: photosensitive azo, photosensitive ester or ether, photosensitive amide or imide, photosensitive amine or imine, photosensitive thio-ether or thio-ester, photosensitive isocyamides, and photosensitive hetero-ring system with at least one of hetero-atom (e.g., N, O, S, B, P, etc.). The commonly-known PLGs are listed as follows and the wavelength at which they decompose: α-carboxy-2-nitrobenzyl (CNB) (260 nm), 1-(2-nitrophenyl)ethyl (NPE, 260 nm), 4,5-dimethoxy-2-nitrobenzyl (DMNB, 355 nm), 1-(4,5-dimethoxy-2-nitrophenyl)ethyl (DMNPE, 355 nm), (4,5-dimethoxy-2-nitrobenzoxy)carbonyl (NVOC, 355 nm), 5-carboxymethoxy-2-nitrobenzyl (CMNB, 320 nm), ((5-carboxymethoxy-2-nitrobenzyl)oxy)carbonyl (CMNCBZ, 320 nm), desoxybenzoinyl (desyl, 360 nm), and (anthraquino-2-yl)methoxycarbonyl (AQMOC, 350 nm).

Any of the foregoing PLGs may be employed in the practice of the embodiments herein. As shown in FIG. 3, the capping photolabile group (PLG) 36 is introduced into the switchable molecule 30 via the connecting group 34, which in turn is connected to the switching moiety 32. The placement of the photolabile group 36 on the end of the connecting group 34 is conventional; as an example, placing 4-(carboxypropyloxy)-2-nitrobenzyl at the end of a connecting group such as a thiol, involves the reaction of PSG-SH with 4-(carboxypropyloxy)-2-nitrobenzyl bromine. In this manner, a capped molecule 30' is formed (FIG. 3a), which can be formed as a Langmuir-Blodgett film (not shown) on the surface 38a of water 38 (the interface between water and air, maintained in a container or trough 40, as shown schematically in FIG. 3b. The PSG moiety 32 is essentially hydrophobic, while the PLG moiety 36 is essentially hydrophilic. The Con moiety 34 is also hydrophilic.

Figure 3A:
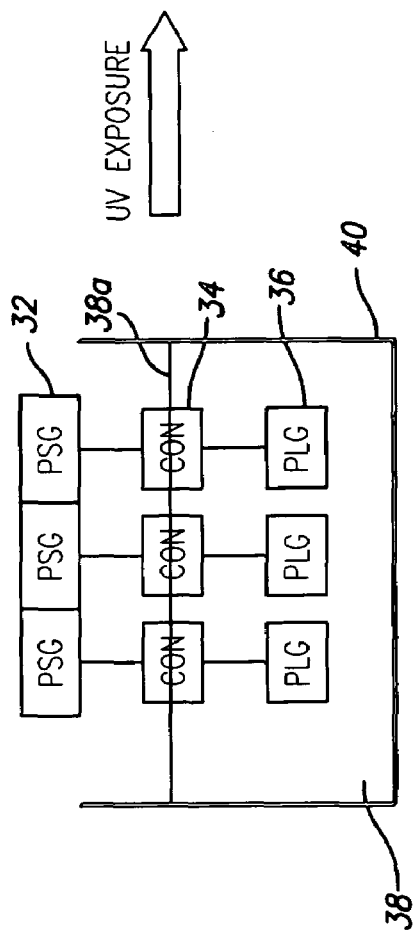
FIG. 3 is a schematic drawing depicting an example of a method of practicing the present invention.
Figure 3B:
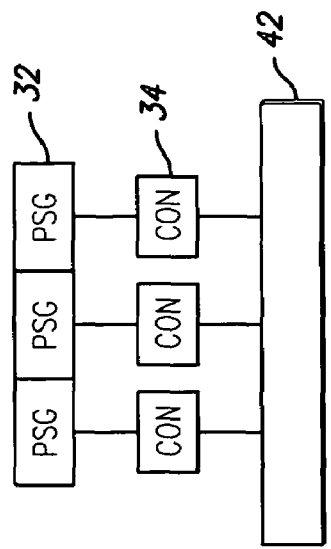
Figure 3C:
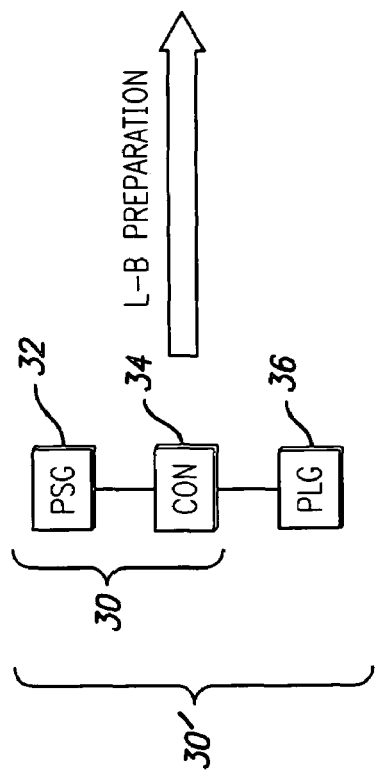

Next, the LB film is exposed to a certain wavelength of UV light. The specific wavelength typically depends on the photolabile moiety 36, but is that wavelength sufficient to cleave the moiety 36 from the molecule 30' and leave the original molecule 30 as the LB film. The photolabile moiety 36 dissolves in the water 38. Thus, the capping group 36 of the molecule 30' decomposes to yield cleaved molecule 30 (with PSG moiety 32 and connecting group 34). The reactive connecting group 34 such as —SH, —OH, or pyridine is at the bottom of the molecule 30, in the water, as shown in FIG. 3c.

Figure 3D:
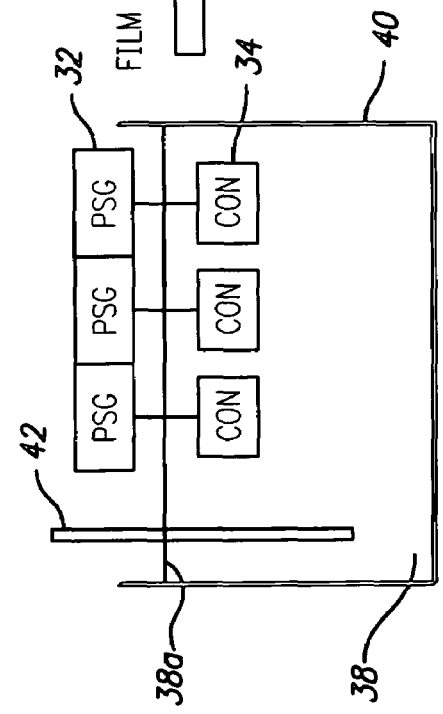

Finally, the uncapped LB film is transferred to a bottom electrode substrate 42, which reacts with the reactive group to form a chemically bonded LB layer, as shown in FIG. 3d. The bottom electrode may comprise any of the metals or semiconductor materials commonly used in such molecular devices as described above. Examples of such bottom electrode materials include, but not limited to, Au, Cu, Ag, W, Ni, Pt, Ti, Al, Hg, Si, etc., and/or alloys thereof.

The following requirements must be met for this process to work:
(a) after introducing the photolabile group 36, the entire molecule 30' should be appropriate to form a LB film;
(b) the photolabile group 36 should be easily uncapped, or cleaved, under UV light exposure at a given wavelength;
(c) the photo-decomposed capping group 36 should be water-soluble;
(d) the switchable molecule 30 (with the switching moiety 32 and the connecting group 34) itself should be stable to UV exposure; and
(e) the connecting group 34 should easily react with the electrode substrate 42 to form a stable chemical bond.

FIG. 4 depicts a more specific molecular system 130' which uses thiol as the connecting group 34 to connect PSG 32 and PLG 36. The components of PSG 32 and PLG 36 are as described above.

As shown in FIG. 4a, the photolabile group (PLG) 36 is incorporated in a switchable molecule 130 via a thiol connecting unit 134 to form a capped molecule 130'. The capped molecule 130' can be made into a LB film on the water-air interface 38a of the trough 40 to give structure shown in FIG. 4b. Next, the film is exposed to the appropriate wavelength of UV light. The capping group 36 of the molecule 130' decomposes to yield the original molecule 130, which itself forms a LB film, with the reactive thiol-connecting group 134 at the bottom of the molecule. The connecting thiol group 134, being hydrophilic, remains in water 38, while the switching moiety 32, being hydrophobic, remains above the surface 38a. The LB film comprising the uncapped molecule 130 is transferred to the bottom electrode substrate 42, as shown in FIG. 4c, which reacts with the reactive thiol group 134 to form a chemically bonded LB layer, as shown in FIG. 4d.

In addition to the requirements listed above, the following requirement must be met for this thiol-based process to work:

(f) the photo-decapping and thin film deposition process should be carried out in an inert atmosphere to ensure that the highly reactive thio or thiol anion group 134 generated from the process will react only with the electrode 42 instead of oxygen in the air.

FIG. 5 depicts a real molecular system 230' which uses thiol as the connecting group 134 and 1-(2-nitrophenyl)ethyl as the photolabile group 236. The PSG group is as described above.

As shown in FIG. 5a, the 1-(2-nitrophenyl)ethyl group (PLG) 236 is incorporated in a switchable molecule 130 via a thiol connecting unit 134 to form a capped molecule 230'. The capped molecule 230' can be made into a LB film on the water-air interface 38a of the trough 40 to give structure shown in FIG. 5b. Next, the film is exposed to the appropriate wavelength of UV light. The capping group 236 of the molecule 230' decomposes to yield the original molecule 130, which itself forms a LB film, with the reactive thiol-connecting group 134 at the bottom of the molecule. The connecting group 134, being hydrophilic, remains in water 38, while the switching moiety 32, being hydrophobic, remains above the surface 38a. The LB film comprising the uncapped molecule 130 is transferred to the bottom electrode substrate 42, as shown in FIG. 5c, which reacts with the reactive thiol group 134 to form a chemically bonded LB layer, as shown in FIG. 5d.

The potential switching group can be any potential switchable moiety, including, but not limited to, rotaxanes, supermolecular complexes such as porphyrins, electric-field or electromagnetic field polarizable molecules, and any hydrocarbons or substituted hydrocarbons systems that contain both rotors and stators.

The methods described herein provide a practical method to make Langmuir-Blodgett films in which the target molecule 30, 130 is chemically bonded with the bottom electrode substrate 42, thereby providing more reliable and less defective LB films. The desirable high density of the molecular layer for device applications is thereby achieved, such high density being associated with LB films, together with the desired chemical bonding of the molecular layer to the substrate previously associated with self-assembled molecules.

The present teachings take advantages of a photolabile capping group to temporarily cap the reactive group of the target molecule. After the capped molecules are made to form a LB film on the water-air interface of water in a trough, the films are exposed to UV light. The photolabile capping group decomposes to give back the reactive group such as —SH, —OH, or pyridine, which remains in the water. As the uncapped LB films are transferred to a bottom electrode substrate, the surface substrate of the electrode reacts with the reactive group of the molecule to form a chemically bonded LB layer on the substrate.

Without subscribing to any particular theory, it appears that the reason that the use of the photolabile capping group 36, 236 provides a superior chemically bonded LB layer on the substrate, compared with using only the PSG-Con molecule 30, 130 alone to form the LB film is that the cleaving of the photolabile group takes place under water in an inert atmosphere, such as nitrogen or argon, thereby protecting the connecting group 32, 132 against oxidation or other reactions in the air.

Based on the foregoing teachings, it will be readily appreciated that another embodiment of the present teachings is directed to a method of forming a crossed wire molecular device comprising a plurality of bottom electrodes, a plurality of top electrodes that cross said bottom electrodes at a non-zero angle, and a molecular layer comprising an organic molecule having at least one switching moiety, with the molecular layer formed in at least some junctions formed where one electrode crosses another electrode. The method comprises:

carrying out the process described above to form the molecular layer on the bottom electrode; and forming the top electrode crossing the bottom electrode at the non-zero angle, thereby forming a junction therebetween, wherein the molecular layer is formed at least in the junction.

In another embodiment of the present teachings, a molecule for Langmuir-Blodgett deposition of a molecular layer is provided. As described above, the molecule comprises at least one switching moiety, a connecting group attached to a switching moiety, and a photolabile group attached to the connecting group. The photolabile group is cleavable from the connecting group in the presence of ultraviolet radiation.

In yet another embodiment of the present teachings, a molecular switching device is provided, comprising at least one bottom electrode and at least one top electrode. The top electrode crosses the bottom electrode at a non-zero angle, thereby forming a junction, and a molecular layer is disposed in the junction. The molecular layer comprises at least one molecule having at least one switching moiety and a connecting group attached to a switching moiety. The molecular layer is formed on the bottom electrode by a Langmuir-Blodgett process to deposit the layer from the molecule having a photolabile group attached to the connecting layer, cleaved by exposure to ultraviolet radiation prior to the formation on the bottom electrode by the Langmuir-Blodgett process.

INDUSTRIAL APPLICABILITY

The temporary use of a switch molecule capped with a photo-labile group is expected to find use in the fabrication of crossed-wire devices.

What is claimed is:

1. An improved method of attaching a molecular layer to a substrate, said molecular layer comprising an organic molecule having at least one switching moiety and a connecting group attached to a said switching moiety, said method comprising:

providing said molecule comprising said at least one switch, moiety and said connecting group, together with a photolabile group attached to said connecting group;

forming a Langmuir-Blodgett film of said molecule on a water surface;

exposing said molecule to ultraviolet radiation of a wavelength sufficient to cleave said photolabile group from said molecule; and passing said substrate through said Langmuir-Blodgett film to form said molecular layer that is chemically bonded on said substrate.

2. The method of claim 1 wherein said switch moiety is selected from the group consisting of moieties that, in the presence of an electric field, either undergo oxidation/ reduction or experience a band gap change.

3. The method of claim 2 wherein said switch moiety undergoes oxidation/reduction and is selected from the group consisting of rotaxanes, pseudo-rotaxanes, and catenanes.

4. The method of claim 2 wherein said switch moiety experiences a band gap change of a type selected from the group consisting of:
   molecular conformation change or an isomerization;
   change of extended conjugation via chemical bonding change to change the band gap; and
   molecular folding or stretching.

5. The method of claim 4 wherein said changing of extended conjugation via chemical bonding change to change the band gap may be accomplished in one of the following ways:
   charge separation or recombination accompanied by increasing or decreasing band localization; or
   change of extended conjugation via charge separation or recombination and π-bond breaking or formation.

6. The method of claim 1 wherein said connecting moiety is a connecting unit between said organic molecule and said substrate.

7. The method of claim 6 wherein said substrate comprises a bottom electrode of a crossed-wire device.

8. The method of claim 6 wherein said connecting moiety is selected from the group consisting of: (a) multivalent hetero atoms selected from the group consisting of C, N, O, S, and P, (b) functional groups containing said hetero atoms and selected from the group consisting of SH, OH, SiCl$_3$, NH, and PH, (c) saturated or unsaturated hydrocarbons, and substituted hydrocarbons.

9. The method of claim 1 wherein said photolabile group is selected from photosensitive moieties consisting of azos, esters, ethers, amide, imides, amines, imines, thio-ethers, thio-esters, isocyamides, and hetero-ring system with at least one of hetero-atom selected from the group consisting of N, O, S, B, and P.

10. The method of claim 9 wherein said photo-labile moiety is selected from the group consisting of α-carboxy-2-nitrobenzyl, 1-(2-nitrophenyl)ethyl, 4,5-dimethoxy-2-nitrobenzyl, 1-(4,5-dimethoxy-2-nitrophenyl)ethyl, (4,5-dimethoxy-2-nitrobenzoxy)carbonyl, 5-carboxymethoxy-2-nitrobenzyl, ((5-carboxymethoxy-2-nitrobenzyl)oxy) carbonyl, desoxybenzoinyl, and (anthraquino-2-yl) methoxy-carbonyl.

11. A method of forming a crossed wire molecular device comprising a plurality of bottom electrodes, a plurality of top electrodes that cross said bottom electrodes at a non-zero angle, and a molecular layer comprising an organic molecule having at least one switching moiety, said molecular layer formed in at least some junctions formed where one electrode crosses another electrode, said method comprising:
   providing said molecule comprising said at least one switch moiety and a connecting group, together with a photolabile group attached to said connecting group;
   forming a Langmuir-Blodgett film of said molecule on a water surface;
   exposing said molecule to ultraviolet radiation of a wavelength sufficient to cleave said photolabile group from said molecule;
   passing said bottom electrode through said Langmuir-Blodgett film to form said molecular layer on a surface of said bottom electrode; and
   forming said top electrode crossing said bottom electrode at said non-zero angle, thereby forming a function therebetween
wherein said molecular layer is formed at least in said junction.

12. The method of claim 11 wherein said switch moiety is selected from the group consisting of moieties that, in the presence of an electric field, either undergo oxidation/reduction or experience a band gap change.

13. The method of claim 12 wherein said switch moiety undergoes oxidation/reduction and is selected from the group consisting of rotaxanes, pseudo-rotaxanes, and catenanes.

14. The method of claim 12 wherein said switch moiety experiences a band gap change of a type selected from the group consisting of:
   molecular conformation change or an isomerization;
   change of extended conjugation via chemical bonding change to change the band gap; and
   molecular folding or stretching.

15. The method of claim 14 wherein said changing of extended conjugation via chemical bonding change to change the band gap may be accomplished in one of the following ways:
   charge separation or recombination accompanied by increasing or decreasing band localization; or
   change of extended conjugation via charge separation or recombination and π-bond breaking or formation.

16. The method of claim 11 wherein said connecting moiety is a connecting unit between said organic molecule and said substrate.

17. The method of claim 16 wherein said substrate comprises a bottom electrode of a crossed-wire device.

18. The method of claim 16 wherein said connecting moiety is selected from the group consisting of: (a) multivalent hetero atoms selected from the group consisting of C, N, O, S, and P, (b) functional groups containing said hetero atoms and selected from the group consisting of SH, OH, SiCl$_3$, NH, and PH, (c) saturated or unsaturated hydrocarbons, and substituted hydrocarbons.

19. The method of claim 11 wherein said photolabile group is selected from photosensitive moieties consisting of azos, esters, ethers, amide, imides, amines, imines, thio-ethers, thio-esters, isocyamides, and hetero-ring system with at least one of hetero-atom selected from the group consisting of N, O, S, B, and P.

20. The method of claim 19 wherein said photo-labile moiety is selected from the group consisting of α-carboxy-2-nitrobenzyl, 1-(2-nitrophenyl)ethyl, 4,5-dimethoxy-2-nitrobenzyl, 1-(4,5-dimethoxy-2-nitrophenyl)ethyl, (4,5-dimethoxy-2-nitrobenzoxy)carbonyl, 5-carboxymethoxy-2-nitrobenzyl, ((5-carboxymethoxy-2-nitrobenzyl)oxy) carbonyl, desoxybenzoinyl, and (anthraquino-2-yl) methoxy-carbonyl.

* * * * *

UNITED STATES PATENT AND TRADEMARK OFFICE
CERTIFICATE OF CORRECTION

PATENT NO. : 7,291,514 B2  Page 1 of 1
APPLICATION NO. : 10/792961
DATED : November 6, 2007
INVENTOR(S) : Zhang-Lin Zhou et al.

It is certified that error appears in the above-identified patent and that said Letters Patent is hereby corrected as shown below:

On the face page, in field (75), under "Inventors", in column 1, line 3, delete "Sunnyvalle, CA" and insert -- Cupertino, CA --, therefor.

In column 6, line 12, delete "bromine" and insert -- bromide --, therefor.

In column 8, line 55, in Claim 1, after "switch" delete ",".

In column 9, line 9, in Claim 4, after "consisting of" delete ";" and insert -- : --, therefor.

In column 10, line 5, in Claim 11, delete "function" and insert -- junction --, therefor.

Signed and Sealed this

Thirteenth Day of May, 2008

JON W. DUDAS
*Director of the United States Patent and Trademark Office*